United States Patent
Tailliet et al.

(10) Patent No.: US 9,472,307 B1
(45) Date of Patent: Oct. 18, 2016

(54) MALFUNCTION CONTROL FOR AN EEPROM TYPE MEMORY DEVICE

(71) Applicant: STMicroelectronics (Rousset) SAS, Rousset (FR)

(72) Inventors: François Tailliet, Fuveau (FR); Marc Battista, Marseilles (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 15/053,989

(22) Filed: Feb. 25, 2016

(30) Foreign Application Priority Data

Sep. 21, 2015 (FR) ...................... 15 58859

(51) Int. Cl.
G11C 5/14 (2006.01)
G11C 29/44 (2006.01)
G11C 16/10 (2006.01)
G11C 16/26 (2006.01)
G11C 16/30 (2006.01)

(52) U.S. Cl.
CPC .......... G11C 29/4401 (2013.01); G11C 16/10 (2013.01); G11C 16/26 (2013.01); G11C 16/30 (2013.01)

(58) Field of Classification Search
CPC ...... G11C 29/52; G11C 29/785; G11C 16/30
See application file for complete search history.

(56) References Cited

U.S. PATENT DOCUMENTS

| | | | |
|---|---|---|---|
| 5,511,183 A * | 4/1996 | Ohmido | G06F 11/1441 361/59 |
| 6,118,315 A | 9/2000 | Guedj | |
| 6,897,689 B2 | 5/2005 | La Rosa | |
| 7,110,314 B2 * | 9/2006 | Murakuki | G11C 7/20 365/226 |
| 2006/0062070 A1 * | 3/2006 | Sibigtroth | G11C 5/145 365/226 |
| 2011/0058420 A1 * | 3/2011 | Yamada | G11C 8/18 365/185.09 |
| 2012/0051133 A1 * | 3/2012 | Kanda | G11C 16/349 365/185.11 |
| 2013/0265841 A1 * | 10/2013 | Duzly | G11C 5/14 365/228 |

FOREIGN PATENT DOCUMENTS

EP 0604270 A1 6/1994
FR 2843660 A1 4/2004

* cited by examiner

Primary Examiner — Tuan T Nguyen
(74) Attorney, Agent, or Firm — Slater Matsil, LLP

(57) ABSTRACT

A method can be used for checking the operation of a device of electrically erasable programmable read-only memory type powered by a power supply voltage and associated with a power on reset circuit. The method includes implementation of at least one pilot operation corresponding to a phase of operation of the device that is identified as a phase that is inclined to malfunction in the event of a drop in the power supply voltage below a given value, execution of the at least one pilot operation during the operation of the memory device, and analysis of the result of the pilot operation so as to detect any malfunction not prevented by the reset circuit.

23 Claims, 3 Drawing Sheets

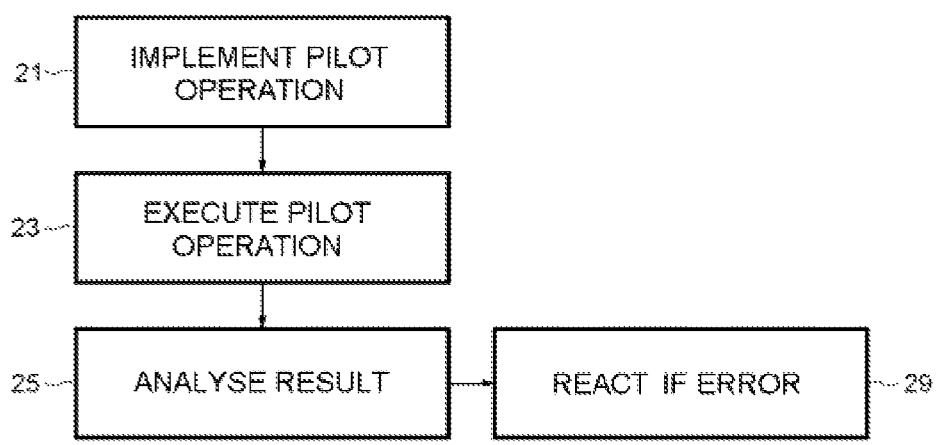
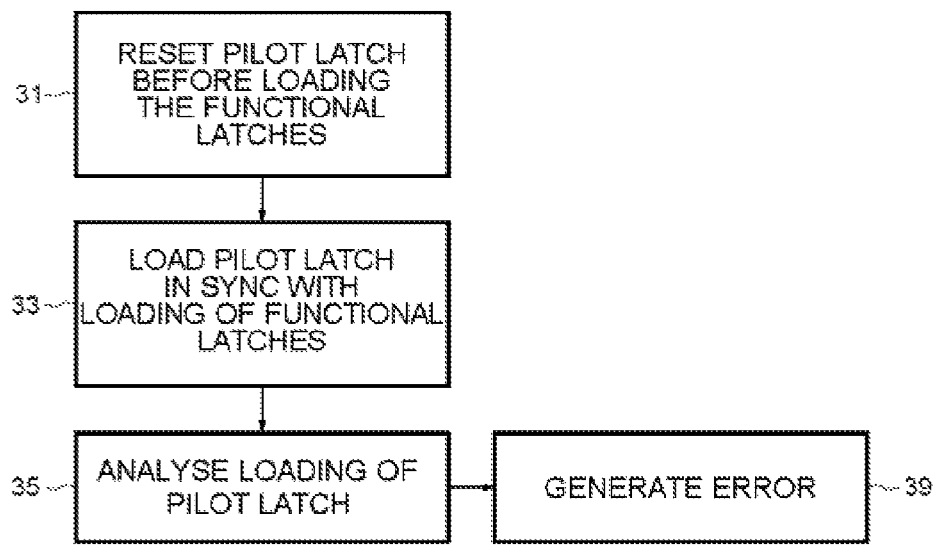

MALFUNCTION CONTROL FOR AN EEPROM TYPE MEMORY DEVICE

This application claims priority to French Application No. 1558859, filed on Sep. 21, 2015, which application is hereby incorporated herein by reference.

TECHNICAL FIELD

Implementations and embodiments of the invention concern memories, notably non-volatile memories of electrically erasable programmable type (EEPROM), in particular the detection of any malfunction in the memory.

BACKGROUND

The invention applies notably, but not restrictively, to memories that are capable of operating over a wide range of power supply voltages including low voltages (for example between 1.6 V and 5.5 V).

The use of a power on reset circuit, commonly denoted by "POR", is prevalent in memory devices of EEPROM type.

A POR circuit generates a reset signal, which is notably applied to the registers of the functional circuit with which it is associated, when the power supply voltage reaches a specified minimum operating value. This makes it possible to ensure that the functional circuit begins to operate in a known state.

It is likewise known that a POR circuit can be used as a protection circuit by detecting a drop in power supply voltage below a threshold level.

Such a circuit is advantageously used on memory devices of EEPROM type, avoiding incorrect reading or memory storage of corrupt data when the power supply falls below a voltage that is referred to as a malfunction voltage.

Thus, the threshold level of a POR circuit needs to be above the malfunction voltage and below the specified minimum operating voltage of the memory.

However, the threshold level of a POR circuit can vary by a few hundred millivolts, notably because of manufacturing constraints, temperature or ageing of the components. Thus, the effective threshold level of a POR circuit is generally in a range limited by an upper limit and a lower limit.

To avoid malfunctions, it is recommended that the level of the lower limit be above the malfunction voltage, and to avoid untimely triggering of a "reset" signal, it is recommended that the level of the upper limit be below the minimum operating voltage.

This condition can give rise to difficulties when the margin between the specified minimum operating voltage and the malfunction voltage is narrower than the range defined by the limits of the effective threshold level of the POR.

This is because in such a case, and in accordance with the variations in the effective threshold level, it will be possible for the POR not to detect a power supply voltage level below the malfunction voltage. It will likewise be possible for the POR to trigger "reset" signals during normal operation.

By way of example, and without restriction, a non-volatile memory device can have a specified minimum operating voltage at 1.5 V, and a first malfunction owing to a fall in voltage to 1.4 V. If the threshold level of the POR can vary in a range of 200 mV, by way of example, it will then not be possible in this case to have both the upper limit of the threshold level below the minimum operating voltage and the lower limit of the threshold level above the malfunction voltage.

Furthermore, the lower limit of the POR circuit can be correct for ensuring the power on reset but can be too low for preventing malfunctions.

By way of example, a memory operating at 20 MHz, under 5 V risks suffering malfunctions if data are interchanged at 20 MHz in the event of a slow drop in voltage from the value of 5 V. Moreover, such a malfunction will not be able to be prevented by a POR circuit.

SUMMARY

Thus, one embodiment proposes equipping electronic circuits, notably of EEPROM memory type, with supplementary protection against malfunctions that are likely not to be prevented by a POR circuit.

According to one aspect, the proposed invention is a method for checking the operation of a device of electrically erasable programmable read-only memory type powered by a power supply voltage and associated with a power on reset circuit. At least one pilot operation corresponds to a phase of operation of the device that is identified as a phase that is inclined to malfunction in the event of a drop in the power supply voltage below a given value. The at least one pilot operation is executed during operation of the memory device. A result of the pilot operation is analyzed so as to detect any malfunction not prevented by the reset circuit.

Thus, when a voltage drop is not detected by the POR circuit, for example, a malfunction owing to a voltage drop can be detected by observing the in-situ behavior of a pilot operation.

As the pilot operation is a reproduction of a real phase of operation of the device, a malfunction in the pilot operation has a good chance of being representative of a malfunction in the real phase of operation.

It is advantageous to reproduce phases of operation that are particularly sensitive to a voltage drop, and it is possible to identify them by virtue of computer-implemented simulations, for example.

According to one implementation, the phase of operation is part of an operation for writing at least one datum in the memory map of the memory device.

The execution of the pilot operation can be carried out during the phase of operation.

The reason is that it is advantageous to carry out the execution of the pilot operation at the same time as the execution of the phase of operation of the device in order to detect a possible malfunction at the moment at which it occurs. This anticipates the phases of verification after the execution of phases of operation of the device, allowing a time gain, complemented by potential identification of the defective operation.

Furthermore, some malfunctions, for example corruption of the data, would not necessarily be able to be corrected after the event.

In a phase of writing to a memory of EEPROM type, the data to be stored in memory are generally transmitted by a bus and loaded into a bit line latch. In accordance with the SPI protocol, for example, the loading of the latch is synchronized to the communication clock signal of the bus. The clock signal of the bus may be faster than the capacity of the latches for processing the signal, notably because of size constraints during the manufacture of the latches or because of the presence of high-voltage transistors. The reason is that size constraints or the presence of high-voltage transistors make these latches slow, which then potentially translates into distortion of the written data.

Thus, according to one implementation, the implementation of the at least one pilot operation comprises the realization of a pilot bit line latch exhibiting a physical implementation that is the most unfavorable in terms of speed, in particular exhibiting maximum internal parasitic capacitances, and the execution of the pilot operation comprises the delivery of a logic "1" to the input of the pilot latch at the same time as the loading of at least one functional latch of the memory device using a loading pulse, and the analysis of the result of the pilot operation comprises the analysis of the content of the pilot latch after the loading pulse.

The memories of EEPROM type can use an error correction code (ECC) mechanism, in particular high-density memories.

These mechanisms generally execute read, error correction and parity bit computation operations. However, very little time is allocated to these operations, possibly making them prone to malfunctions.

The reason is that error correction code mechanisms are usually relatively complex and some propagation paths of the corresponding circuits can be long, so much so that the propagation time of the signal in such a path could, under certain operating conditions (temperature, etc.), exceed the period allocated to this operation, again leading to distortion of the data.

Thus, according to another implementation, the implementation of the at least one pilot operation comprises the realization of at least one pilot sense amplifier, and the execution of the pilot operation comprises the delivery of at least one pilot datum at the input of the at least one pilot sense amplifier, and the analysis of the result of the pilot operation comprises analysis of the output of the at least one sense amplifier after the expiry of a functional read period.

The implementation of the at least one pilot operation may likewise comprise realization of a maximum propagation path for an error correction code circuit, the execution of the pilot operation comprises the delivery of a signal at the input of the propagation path and the analysis of the result of the pilot operation comprises the verification of the delivery of the signal at the output of the propagation path after the expiry of a functional period allocated to error correction code processing.

An error bit can be sent to a register when a malfunction is detected.

As a variant, all write operations can be suspended when a malfunction is detected.

According to another aspect, the proposed invention is a device of electrically erasable programmable read-only memory type powered by a power supply voltage and associated with a power on reset circuit. At least one pilot module corresponds to at least one circuit of the device that is identified as inclined to malfunction in the event of a drop in the power supply voltage below a given value. A controller is capable of implementing the at least one pilot module during the operation of the memory device. An analysis circuit is configured to analyze the result of the implementation of the pilot module so as to detect any malfunction not prevented by the reset circuit.

According to one embodiment, the circuit of the device is part of a write circuit for at least one datum in the memory map of the memory device.

According to one embodiment, the controller are configured to implement the pilot module during the implementation of the at least one circuit of the device.

According to one embodiment, the pilot module comprises a pilot bit line latch exhibiting a physical implementation that is the most unfavorable in terms of speed, in particular, exhibiting maximum internal parasitic capacitances, the controller is configured to deliver a logic "1" to the input of the pilot latch at the same time as the loading of at least one functional bit line latch of the memory device using a loading pulse, and the analysis circuit is configured to check the content of the pilot latch after the loading.

According to another embodiment, the pilot module comprises at least one pilot sense amplifier, the controller is configured to deliver at least one pilot datum at the input of the at least one pilot sense amplifier, and the analysis circuit is configured to check the output of the at least one pilot sense amplifier after the expiry of a functional read period.

According to another embodiment, the at least one pilot module comprises a maximum propagation path of an error correction code circuit, a controller is capable of delivering a signal at the input of the propagation path, and the analysis circuit is capable of checking the delivery of the signal at the output of the propagation path after the expiry of a functional period allocated to error correction code processing.

The analysis circuit can be configured to send an error signal to a register when a malfunction is detected, or else to suspend all write operations when a malfunction is detected.

BRIEF DESCRIPTION OF THE DRAWINGS

Other advantages and features of the invention will emerge upon examining the detailed description of implementations and embodiments, which are no way restrictive, and the appended drawings, in which:

FIGS. 1 to 5 schematically illustrate various implementations and embodiments of the invention.

DETAILED DESCRIPTION OF ILLUSTRATIVE EMBODIMENTS

Figure 1:
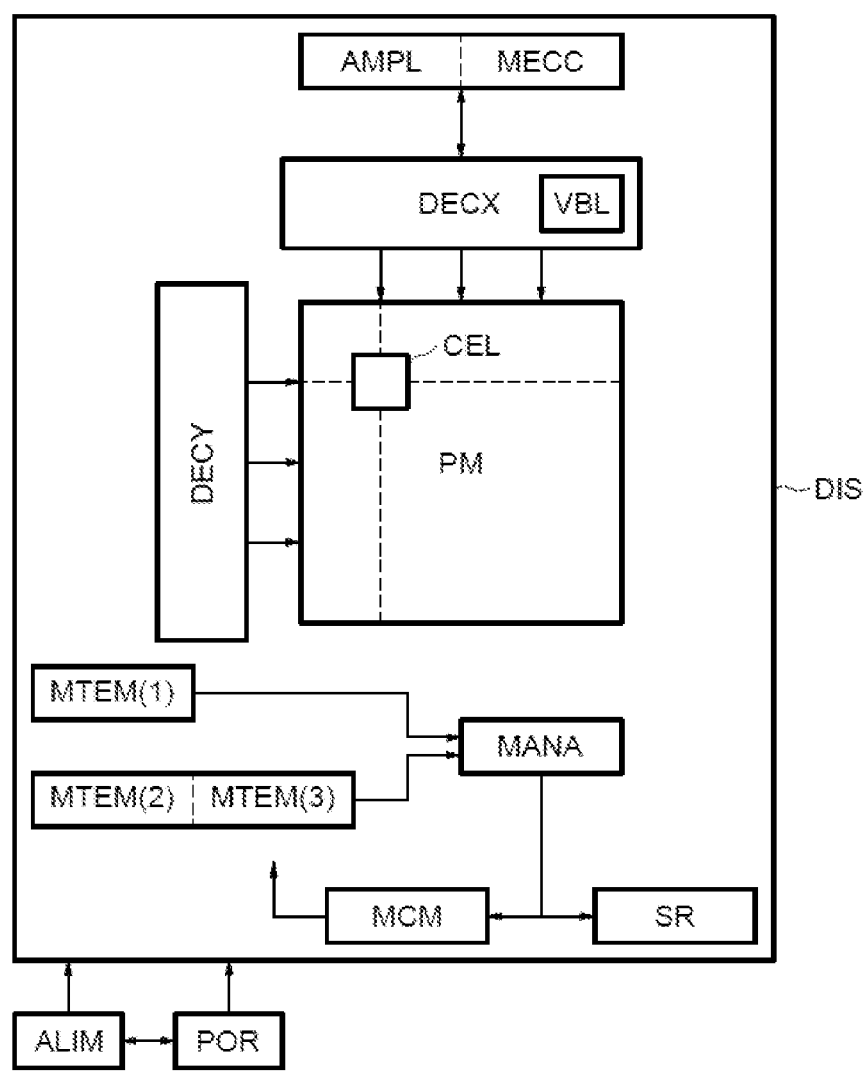

FIG. 1 shows an EEPROM memory device DIS according to the invention that is powered by a power supply unit ALIM and associated with a power on reset circuit POR, with a conventional structure that is known per se.

The device DIS has a memory map PM of memory cells CEL, and conventional write circuit MECR, row and column decoders DECX and DECY, bit line latches VBL incorporated into the decoder DECX, and read circuit having sense amplifiers AMPL, with conventional structures that are known per se.

The device DIS likewise has, in this exemplary embodiment an error correction code mechanism MECC, with a conventional structure that is known per se.

The device DIS likewise comprises a controller MCM having, by way of example, logic circuitry with conventional structures that are capable of activating notably the various circuits, e.g., write circuit MECR, read circuit AMPL and the error correction code mechanism MECC.

The memory device DIS likewise has pilot modules MTEM(1), MTEM(2) and MTEM(3), and analysis circuit MANA.

The controller MCM is likewise configured to control the pilot modules MTEM(1), MTEM(2), MTEM(3).

The analysis circuit MANA is capable of verifying the behavior of the pilot modules and are connected notably to the controller MCM and to a register SR.

The pilot modules correspond, by way of example, to circuits of the functional memory unit that are identified as inclined to malfunction in the event of a drop of the power supply voltage below a given value.

By way of example, the pilot module MTEM(1) can emulate a bit line latch circuit. The pilot module MTEM(2) may be a reproduction of a sense amplifier AMPL. The pilot module MTEM(3) may be a reproduction of a propagation path of an error correction code mechanism.

Before returning in more detail to these examples, general execution of the method for checking the operation of a device of EEPROM memory type according to the invention will be described, with more particular reference to FIG. 2.

In step 21, a pilot operation is implemented in a memory module. The pilot operation is chosen so as to correspond to a phase of operation of the memory device that is identified as a phase that is inclined to malfunction in the event of a voltage drop. The aim of this implementation is to emulate (or reproduce), by making the adaptations necessary to its operation, a circuit or process that is already present and functional in the memory device to be checked.

The phase of operation that is reproduced by the pilot operation may be part of an operation for writing a datum in the memory map of the device, for example a phase of loading a bit line latch, or may be a read phase of a sense amplifier, for example, included in a processing phase carried out by an error correction code circuit.

The pilot operation is then executed (step 23). By way of example, this execution comprises delivery of a test signal at the input of the corresponding pilot module MTEM(i).

The result of the pilot operation is then analyzed (step 25). By way of example, this analysis comprises the comparison of a result at the output of the pilot operation with an expected result. The expected result is the result that the functional circuits or operation reproduced would provide during normal operation of the device if the test signal were applied to it. If the comparison reveals a different result from the expected result, a malfunction is detected and an error signal is generated. The comparison is made by the analysis circuit MANA, which are capable of generating the error signal, and/or of acting on the controller MCM of the device.

In the case of an emulation of a bit line latch circuit, the test signal may be a bit in the logic "1" state, for example, and the result expected at the output of the pilot module may be a bit in the logic "0" state.

Step 29 comprises a reaction when a malfunction is detected in step 25. By way of example, the reaction may comprise the loading of the error signal into the register RS, and/or the suspension of all write operations of the device, by way of the controller MCM of the device.

As the pilot operation stems from reproduction of an existing circuitry or processing of the device, performing detection for such an operation makes it possible to take account of hazards that are difficult to foresee, such as, and without restriction, undesirable thermal effects, electromagnetic interference or else, preferably, a drop in the power supply voltage, which would not be taken into account by the POR circuit.

Figure 4:
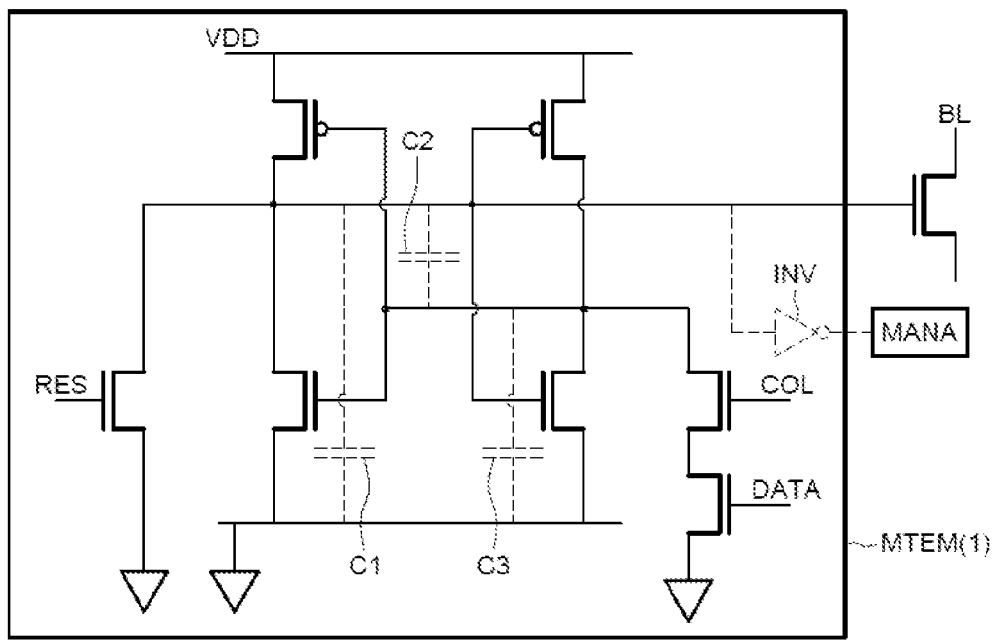

FIG. 3 illustrates an implementation of a method according to the invention, in which the pilot operation corresponds to a phase of loading a pilot bit line latch MTEM(1), an exemplary embodiment of which is illustrated in FIG. 4.

The branches and components of the circuit that are shown in solid lines represent those of a conventional functional bit line latch circuit BL.

The portion in broken lines represents additions, for example of the parasitic capacitances C1, C2, C3.

These parasitic capacitances can be implemented in various ways in order to make the pilot latch "more sensitive" to a voltage drop than a functional latch and to correspond notably to a situation close to a real worst case of operation.

In step 31, the pilot latch is reset via the RES branch of the circuit MTEM(1) in FIG. 4, allocating a sufficient reset deadline for the reset to be performed before the functional latches are loaded. This makes it possible to ensure that the pilot latch is in a known state before the loading step.

In an embodiment in which the data are loaded into the bit line latches in bytes, the loading is accomplished in accordance with eight clock pulses. Resetting the pilot latch on the fourth clock pulse of the loading preceding the test allows a sufficient reset deadline to be allocated, for example.

In step 33, the pilot latch is loaded at the same time as the functional latches of the circuit are loaded. Loading of the pilot latch is accomplished via a logic gate of AND type (or of OR type) of the same design as the functional logic gates delivering the selection signal for the functional latches. In the embodiment in FIG. 4, the output of the logic gate is applied to the COL branch of the circuit MTEM(1). In order to control the data loaded into the pilot latch, only logic "1"s are delivered at the input of the logic gate and a logic "1" is applied to the DATA branch of the circuit MTEM(1) in FIG. 4.

In step 35, the content of the pilot latch is analyzed. A logic "1" state at the output of the inverter INV is representative of bad loading, and the analysis circuit can then generate an error signal (step 39).

Figure 5:
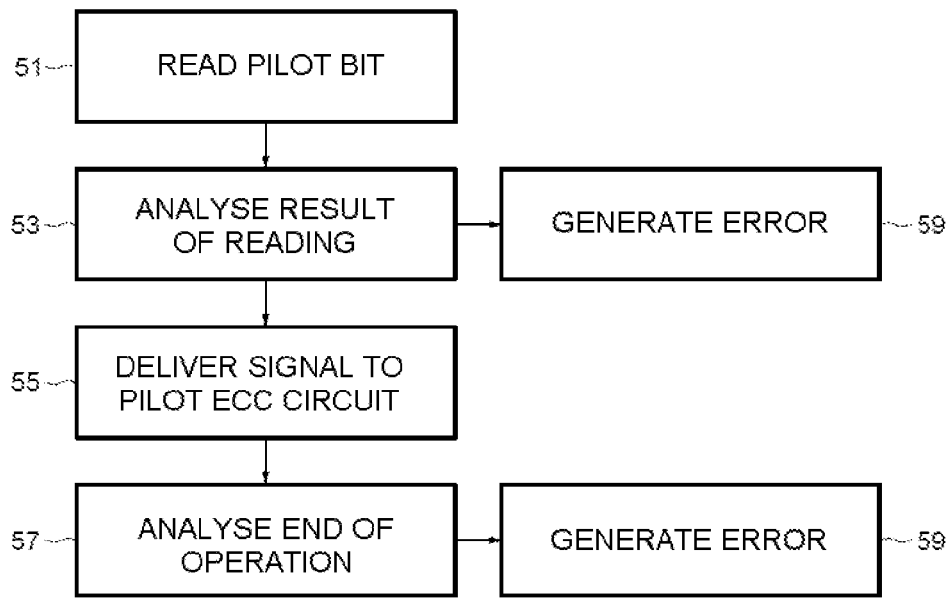

FIG. 5 illustrates the case in which the pilot operation corresponds to an operation executed within the error correction code mechanism MECC.

The pilot module MTEM(2) is a pilot sense amplifier, similar to a functional sense amplifier AMPL, and the pilot module MTEM(3) is a pilot maximum propagation path of the functional error correction code circuit MECC.

In step 51, a pilot bit that is delivered at the input of the module MTEM(2) is read at the conclusion of a read period that is identical to that allocated to the reading of a bit when a functional sense amplifier is implemented. The pilot bit to be read may be a logic "1" or a logic "0." It is likewise possible to read the two independently by using two pilot sense amplifiers. This is because the speed of reading a logic "1" or a logic "0" can vary in some embodiments, and it may therefore be advantageous to read one or the other, or both.

In step 53, the progress of the reading by the pilot sense amplifier is analyzed. A comparator coupled to the read bit and the bit to be read allow a malfunction to be detected in the event of a mismatch (step 59).

In step 55, a known signal is applied at the input of the pilot maximum propagation path.

In step 57, a check is performed to determine whether the signal has or has not been able to cross the pilot maximum propagation path during the allocated time. In the second case, a malfunction is detected.

When a malfunction is detected, an error signal is generated by the analysis circuit (step 59).

The invention notably allows the reliability of devices of EEPROM memory type to be increased over a broad field of applications, notably in cases of misuse of a device, on high-speed memory buses, for example in accordance with the SPI protocol.

The invention can notably apply to systems having a power supply voltage that varies over a wide range of voltages, for example from 1.6 V to 5.5 V.

What is claimed is:
1. A method for checking an operation of an electrically erasable programmable read-only memory type device that is powered by a power supply voltage and associated with a power on reset circuit, the method comprising:

implementing a pilot operation that corresponds to a phase of operation of the device that is identified as a phase that is inclined to malfunction upon a drop in the power supply voltage below a given value;

executing the pilot operation during operation of the device; and analyzing a result of the pilot operation so as to detect any malfunction not prevented by the reset circuit.

2. The method according to claim 1, wherein the phase of operation is part of an operation for writing at least one datum in a memory map of the device.

3. The method according to claim 1, wherein executing the pilot operation is carried out during the phase of operation.

4. The method according to claim 1, wherein implementing the pilot operation comprises realizing a pilot bit line latch exhibiting a physical implementation that is unfavorable in terms of speed, and wherein executing the pilot operation comprises delivering a logic "1" to an input of the pilot bit line latch at the same time as a functional latch of the device is loaded using a loading pulse, and wherein analyzing the result of the pilot operation comprises analyzing a content of the pilot bit line latch after the loading pulse.

5. The method according to claim 1, wherein implementing the pilot operation comprises realizing a pilot sense amplifier, wherein executing the pilot operation comprises delivering a pilot datum at an input of the pilot sense amplifier, and analyzing a result of the pilot operation comprises analyzing an output of the pilot sense amplifier after expiration of a functional read period.

6. The method according to claim 1, wherein implementing the pilot operation comprises realizing a maximum propagation path for an error correction code circuit, wherein executing the pilot operation comprises delivering a signal and an input of the maximum propagation path, and wherein analyzing the result of the pilot operation comprises verifying delivery of the signal at an output of the maximum propagation path after expiration of a functional period allocated to error correction code processing.

7. The method according to claim 1, further comprising sending an error bit to a register when a malfunction is detected.

8. The method according to claim 1, further comprising suspending all write operations when a malfunction is detected.

9. An electrically erasable programmable read-only memory type device powered by a power supply voltage and associated with a power on reset circuit, the device comprising:

a pilot module corresponding to a circuit of the device that is identified as inclined to malfunction upon a drop in the power supply voltage below a given value;

a controller coupled to the pilot module so as to control the pilot module during operation of the device; and an analysis circuit configured to analyze a result of implementation of the pilot module so as to detect any malfunction not prevented by the reset circuit.

10. The device according to claim 9, wherein the circuit of the device is part of a write circuit that is used to data in a memory map of the device.

11. The device according to claim 9, wherein the controller is configured to implement the pilot module during implementation of the circuit of the device.

12. The device according to claim 9, wherein:

the pilot module comprises a pilot bit line latch exhibiting a physical implementation that is unfavorable in terms of speed;

the controller is configured to deliver a logic "1" to an input of the pilot bit line latch at the same time as loading of a functional bit line latch of the memory device using a loading pulse; and the analysis circuit is configured to check a content of the pilot bit line latch after the loading.

13. The device according to claim 9, wherein:

the pilot module comprises a pilot sense amplifier;

the controller is configured to deliver pilot data to an input of the pilot sense amplifier; and the analysis circuit is configured to check an output of the pilot sense amplifier after expiration of a functional read period.

14. The device according to claim 9, wherein:

the pilot module comprises a realization of a maximum propagation path of an error correction code circuit;

the controller is configured to deliver a signal to an input of the maximum propagation path; and the analysis circuit is configured to check delivery of the signal at an output of the maximum propagation path after expiration of a functional period allocated to error correction code processing.

15. The device according to claim 9, wherein the analysis circuit is configured to send an error bit to a register when a malfunction is detected.

16. The device according to claim 9, wherein the analysis circuit is configured to suspend all write operations when a malfunction is detected.

17. A method of operating an electrically erasable programmable read-only memory device that is powered by a power supply voltage and associated with a power-on reset circuit, the method comprising:

initiating an operation of a circuit of the memory device and at the same time initiating operation of a pilot module that corresponds to the circuit of the device, the circuit of the memory device being identified as inclined to malfunction upon a drop in the power supply voltage below a given value;

analyzing a result of the operation of the pilot module so as to detect any malfunction not prevented by the power-on reset circuit; and performing an action if a malfunction is detected.

18. The method according to claim 17, wherein the circuit of the memory device is part of a write circuit that is used to data in a memory map of the memory device.

19. The method according to claim 17, wherein:

the pilot module comprises a pilot bit line latch exhibiting a physical implementation that is unfavorable in terms of speed;

initiating operation of the pilot module comprises providing a logic "1" to an input of the pilot bit line latch at the same time as loading of a functional bit line latch of the memory device; and analyzing the result comprises checking a content of the pilot bit line latch after the loading.

20. The method according to claim 17, wherein:

the pilot module comprises a pilot sense amplifier;

initiating operation of the pilot module comprises providing pilot data to an input of the pilot sense amplifier; and analyzing the result comprises checking an output of the pilot sense amplifier after expiration of a functional read period.

21. The method according to claim 17, wherein:
the pilot module comprises a realization of a maximum propagation path of an error correction code circuit;
initiating operation of the pilot module comprises delivering a signal to an input of the maximum propagation path; and
analyzing the result comprises checking delivery of the signal at an output of the maximum propagation path after expiration of a functional period allocated error correction code processing.

22. The method according to claim 17, wherein performing the action comprises sending an error bit to a register when a malfunction is detected.

23. The method according to claim 17, wherein performing the action comprises suspending all write operations when a malfunction is detected.

* * * * *